(12) United States Patent
Fischer et al.

(10) Patent No.: US 11,255,911 B2
(45) Date of Patent: Feb. 22, 2022

(54) METHOD AND DEVICE FOR TESTING AT A SPECIFIC CHANNEL CONDITION

(71) Applicant: Rohde & Schwarz GmbH & Co. KG, Munich (DE)

(72) Inventors: Robert Fischer, Taufkirchen (DE); Christian Sieber, Munich (DE)

(73) Assignee: Rohde & Schwarz GmbH & Co., Munich (DE)

( * ) Notice: Subject to any disclaimer, the term of this patent is extended or adjusted under 35 U.S.C. 154(b) by 292 days.

(21) Appl. No.: 16/529,379

(22) Filed: Aug. 1, 2019

(65) Prior Publication Data

US 2021/0033672 A1 Feb. 4, 2021

(51) Int. Cl.
*G01R 31/302* (2006.01)
*G01R 31/319* (2006.01)

(52) U.S. Cl.
CPC ... *G01R 31/31926* (2013.01); *G01R 31/3025* (2013.01); *G01R 31/31905* (2013.01)

(58) Field of Classification Search
CPC .......... G01R 31/31813; G01R 31/3181; G01R 31/3004; G01R 31/2884; G01R 19/257; H04B 17/00; H04J 3/14; H04L 43/00; H04L 43/50; H04W 24/00
See application file for complete search history.

(56) References Cited

U.S. PATENT DOCUMENTS

| | | | |
|---|---|---|---|
| 8,731,493 B2* | 5/2014 | Luong | H04L 43/16 455/115.2 |
| 9,941,983 B1* | 4/2018 | Seebacher | H04B 17/0085 |
| 2018/0352606 A1 | 12/2018 | Kasagi et al. | |
| 2019/0190840 A1* | 6/2019 | Cao | H04L 47/283 |

* cited by examiner

*Primary Examiner* — Tung X Nguyen
(74) *Attorney, Agent, or Firm* — Ditthavong, Steiner & Mlotkowski

(57) ABSTRACT

A method for testing a device under test at a specific channel condition is provided. The method comprises the steps of initiating a communication with the device under test and receiving a transmission frame from the device under test with a header portion comprising a specific transmission rate information. It also comprises analyzing the header portion of the transmission frame in order to determine whether the device under test is transmitting with the specific transmission rate information.

18 Claims, 4 Drawing Sheets

| Streams | 1 | 2 | 1 | 2 | 1 | 2 |
|---|---|---|---|---|---|---|
| MCS \ BW | 20 MHz | | 40 MHz | | 80 MHz | |
| 0 | x | x | x | x | | |
| 1 | x | x | x | x | | |
| 2 | x | x | x | x | | |
| 3 | x | x | x | x | | |
| 4 | x | x | x | | | |
| 5 | x | x | x | | | |
| 6 | x | x | x | | | |
| 7 | x | x | x | | | |
| 8 | x | x | x | | | |
| 9 | x | x | x | | | |

Fig. 3

Generic

NON_HT

HT_MF

HT_GF

VHT

METHOD AND DEVICE FOR TESTING AT A SPECIFIC CHANNEL CONDITION

TECHNICAL FIELD

The invention relates to testing a device under test at a specific channel condition, especially in a wireless local area network (WLAN) according to the IEEE 802.11 standards.

BACKGROUND ART

The IEEE 802.11 is a set of local area network (LAN) protocols that specifies protocols for implementing WLAN in a range of frequencies. Generally, in such a communication network, a basic service set governing an access point and at least one wireless device facilitates a wide range of operating bandwidths, including but not limited to 20, 40 and 80 MHz, thereby defining different channel conditions. Moreover, the basic service set further supports multiple simultaneous spatial streams. The wireless device can therefore utilize any specific channel condition, especially in terms of modulation and coding schemes (MCS), bandwidth, number of spatial streams and so on. Consequently, in order to test such a wireless device for a specific modulation, for instance for a specific combination of MCS, bandwidth and the number of spatial streams, the wireless device is required to be controlled externally.

For example, the document US 2018/0352606 A1 shows a rate control method and a corresponding apparatus for the transmitted frames from a device under test. The transmitted frames are received and then analyzed in order to determine whether a received MCS index of the frame matches a predetermined MCS index. If the received MCS index differs with respect to the target MCS index, the acknowledgement towards the device under test is halted. As a result, the device under test is forced to reduce its MCS index. However, in order to determine the received MCS index, the apparatus is required to receive and to further process the whole transmitted frame in the expense of a large amount of processing power and network resources.

Accordingly, there is a need to provide a method and a device for testing a device under test at a specific channel condition in a simplified manner, which requires less computation power and network resources.

SUMMARY OF THE INVENTION

According to a first aspect of the invention, a method for testing a device under test at a specific channel condition is provided. The method comprises the steps of initiating a communication with the device under test, receiving a transmission frame from the device under test with a header portion comprising a specific transmission rate information, and analyzing the header portion of the transmission frame in order to determine whether the device under test is transmitting with the specific transmission rate information.

Therefore, instead of analyzing the whole transmitted frame, only the header portion of the transmitted frame, for instance a burst transmission frame, is processed. Consequently, less amount of computation power is needed since only the header portion is processed, thereby further improving the processing speed. The resources can be advantageously allocated elsewhere.

According to a first preferred implementation form of said first aspect of the invention, the method further comprises the step of processing the transmission frame if the header portion comprises the specific transmission rate information. Advantageously, the required amount of network resources is significantly reduced.

According to a second preferred implementation form of said first aspect of the invention, the method further comprises the step of cancelling the reception of the transmission frame if the device under test is not transmitting with the specific transmission rate information. Therefore, the reception of the transmitted frame is immediately stopped if the header portion does not comprise the specific transmission rate information.

According to a further preferred implementation form of said first aspect of the invention, the method further comprises the step of withholding the processing of the transmission frame if the header portion does not comprise the specific transmission rate information. Hence, if the device under test does not transmit with the specific transmission rate information, the processing of the data portion of the frame is advantageously cancelled.

According to a further preferred implementation form of said first aspect of the invention, the specific transmission rate information comprises information regarding a selective modulation and coding scheme (MCS), bandwidth and the number of spatial streams (NSS) or a combination thereof. Such a combination may be a part of the signalization portion of the header of the frame. The MCS can be hereby separated into two portions, namely the modulation portion and the coding rate portion. Furthermore, a specific combination of MCS, bandwidth and NSS may allow several MCS, several bandwidth and/or several NSS.

According to a further preferred implementation form of said first aspect of the invention, the method further comprises the step of receiving the transmission rate information from the device under test during and/or after initiating the communication. Advantageously, for instance the processing speed is further improved.

According to a further preferred implementation form of said first aspect of the invention, the method further comprises the step of receiving the transmission frame with a predefined length, preferably a predefined minimum and/or maximum length. Advantageously, the measurement reliability is significantly increased.

According to a further preferred implementation form of said first aspect of the invention, the method further comprises the step of triggering an external pulse with respect to a modulation or coding scheme or bandwidth or the number of spatial streams in order to define the transmission rate information.

Therefore, the external trigger pulse allows for a specific rate transmission measurement by enabling the processing only for a specific combination of MCS, bandwidth and NSS, thereby facilitating a specific channel condition. The device under test is adapting the transmit parameters, for instance MCS, bandwidth and NSS, according to the channel condition. Hence, by simulating a specific channel condition, for instance by receiving frames with specific rate transmission information and by cancelling the reception without it, the device under test is forced to select a rate to be measured for transmission frames.

According to a further preferred implementation form of said first aspect of the invention, the external pulse is configurable and wherein the external pulse is triggered dynamically. Advantageously, more specific combinations of MCS, bandwidth and/or NSS can be used during measurement. In addition, the external pulse may be triggered statically in order to further increase the measurement reliability.

According to a second aspect of the invention, a device for testing a device under test at a specific channel condition is provided. The device comprises a communication unit adapted to initiate a communication with the device under test. In addition, the communication unit is further adapted to receive a transmission frame from the device under test with a header portion comprising a specific transmission rate information. Moreover, the device further comprises a processing unit adapted to analyze the header portion of the transmission frame in order to determine whether the device under test is transmitting with the specific transmission rate information.

Therefore, the processing unit only analyzes the header portion of the transmitted frame, for instance a burst transmission frame, instead of analyzing the whole frame. Advantageously, the processing unit requires less computational power in contrast to the power required for processing the whole frame.

According to a first preferred implementation form of said second aspect of the invention, the processing unit is further adapted to process the transmission frame if the header portion comprises the specific transmission rate information. Advantageously, the required amount of network resources is significantly reduced.

According to a second preferred implementation form of said second aspect of the invention, the communication unit is further adapted to cancel the reception of the transmission frame if the device under test is not transmitting with the specific transmission rate information. Therefore, the device, preferably through the communication unit immediately cancels the frame reception from the device under test if the device under test does not use the specific transmission rate information.

According to a further preferred implementation form of said second aspect of the invention, the processing unit is further adapted to withhold the processing of the transmission frame if the header portion does not comprise the specific transmission rate information. Therefore, in case the device under test does not transmit with the specific transmission rate information, the processing unit will not continue to process the data portion of the frame.

According to a further preferred implementation form of said second aspect of the invention, the specific transmission rate information comprises information regarding a selective modulation or coding scheme or bandwidth or the number of spatial streams or a combination thereof. Such a combination may be a part of the signalization portion of the header of the frame. The MCS can be hereby separated into two portions, namely the modulation portion and the coding rate portion. Furthermore, a specific combination of MCS, bandwidth and NSS may allow several MCS, several bandwidth and/or several NSS.

According to a further preferred implementation form of said second aspect of the invention, the communication unit is further adapted to receive the transmission rate information from the device under test during and/or after initiating the communication. Advantageously, for instance the processing speed is further improved.

According to a further preferred implementation form of said second aspect of the invention, the communication unit is further adapted to receive the transmission frame with a predefined length, preferably a predefined minimum and/or maximum length. Advantageously, the measurement reliability is significantly increased.

According to a further preferred implementation form of said second aspect of the invention, the device further comprises a trigger unit adapted to trigger an external pulse with respect to a modulation and coding scheme, bandwidth and the number of spatial streams in order to define the transmission rate information. In this context, the trigger unit may only trigger, for instance for one MCS out of the several MCS.

Therefore, the trigger unit provides external trigger pulses corresponding to a specific combination of MCS, bandwidth and NSS, thereby configuring the device to process the transmission frames only for the specific MCS, bandwidth and NSS. Consequently, the device advantageously simulates a bad channel condition, for instance by not receiving higher MCS values, bandwidth and/or NSS or a specific channel condition, for instance by only receiving and processing frames with the specific combination. The device under test is therefore adapting the transmission parameters and selects a rate to be measured for transmission frames.

According to a further preferred implementation form of said second aspect of the invention, the external pulse is configurable and wherein the trigger module is further adapted to trigger the external pulse dynamically. Advantageously, the device under test can be tested for more than one specific combination of MCS, bandwidth and/or NSS without significantly changing the test setup. In addition, the external pulse may be triggered statically in order to further increase the measurement reliability.

According to a third aspect of the invention, a system comprising a device according to the second aspect of the invention and a device under test for testing the device under test at a specific channel condition is provided. In this context, the system operates as a part of a Basic Service Set in a wireless local area network. Advantageously, the system allows for a complete assessment of the device under test.

BRIEF DESCRIPTION OF THE DRAWINGS

Exemplary embodiments of the invention are now further explained with respect to the drawings by way of example only, and not for limitation. In the drawings:

FIG. 3 shows a table for specific combinations of MCS, bandwidth and NSS by way of an example.

DETAILED DESCRIPTION OF PREFERRED EMBODIMENTS

Reference will now be made in detail to the embodiments of the present invention, examples of which are illustrated in the accompanying drawings. However, the following embodiments of the present invention may be variously modified and the range of the present invention is not limited by the following embodiments.

Figure 1:
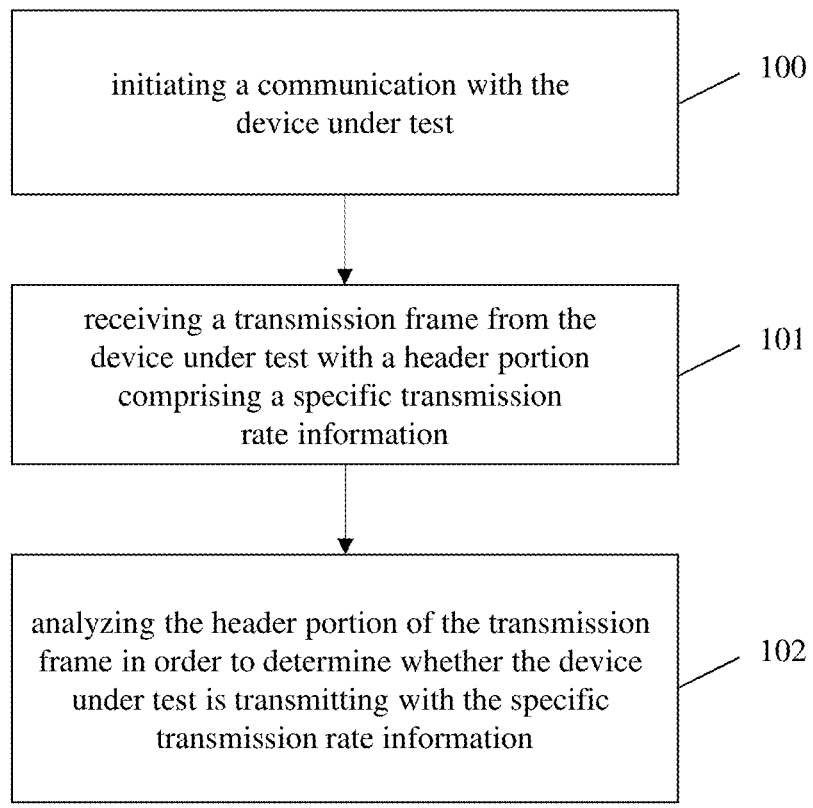
FIG. 1 shows an exemplary embodiment of the method according to the first aspect of the invention.

In FIG. 1, an exemplary embodiment of the method according to the first aspect of the invention is illustrated. In a first step 100, a communication is initiated with the device under test. In a second step 101, a transmission frame is received from the device under test with a header portion comprising a specific transmission rate information. In a third step 102, the header portion of the transmission frame is analyzed in order to determine whether the device under test is transmitting with the specific transmission rate information.

In addition to this, the method further comprises the step of processing the transmission frame if the header portion comprises the specific transmission rate information.

Moreover, the method further comprises the step of cancelling the reception of the transmission frame if the device under test is not transmitting with the specific transmission rate information.

It might be further advantageous if the method further comprises the step of withholding the processing of the transmission frame if the header portion does not comprise the specific transmission rate information.

It is to be noted that the specific transmission rate information comprises information regarding a selective modulation and coding scheme, bandwidth and the number of spatial streams or a combination thereof.

Furthermore, the method further comprises the step of receiving the transmission rate information from the device under test during and/or after initiating the communication.

In addition to this, the method further comprises the step of receiving the transmission frame with a predefined length, preferably a predefined minimum and/or maximum length.

Moreover, the method further comprises the step of triggering an external pulse with respect to a modulation and coding scheme, bandwidth and the number of spatial streams in order to define the transmission rate information. In this context, the external pulse is configurable and is triggered dynamically.

Figure 2:
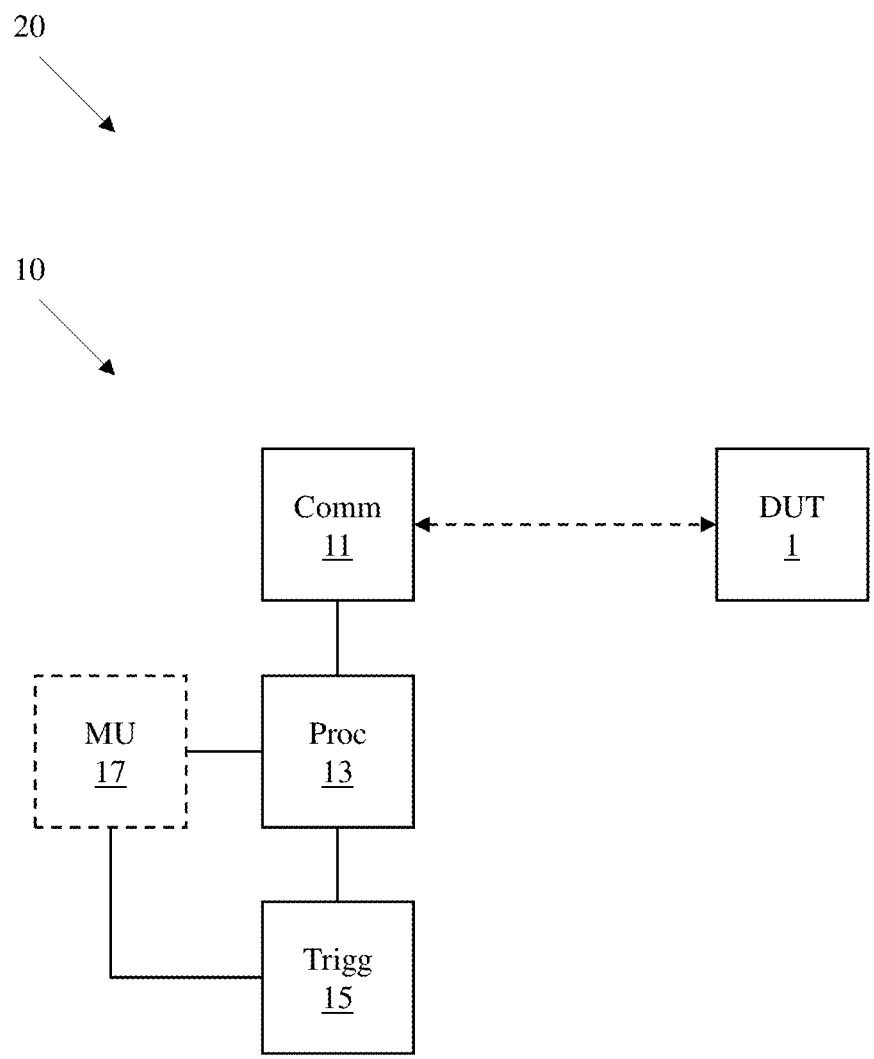
FIG. 2 shows an exemplary embodiment of the device according to the second aspect of the invention and the system according to the third aspect of the invention.

In FIG. 2, an exemplary embodiment of the device 10 according to the second aspect of the invention and the system 20 according to the third aspect of the invention are illustrated. The device 10 comprises a communication unit 11 in order to initiate a communication link, preferably a wireless communication link according to the IEEE 802.11 standards, with a device under test 1. The communication unit 11 preferably comprises signal transmission and reception means as well as signal conversion means. Hence, the communication unit 11 is adapted to transmit control signals and/or management frames towards the device under test 1 and is further adapted to receive transmission frames from the device under test 1.

The device 10 further comprises a processing unit 13 connected to the communication unit 11 either wirelessly or via RF cables. The processing unit 13 may also be referred to as microcontrollers, microprocessors, microcomputers, etc. The processing unit 13 may further be configured in hardware, firmware, software, or their combination.

The processing unit 13 initially processes the transmission frames from the device under test 1 only or up to the header portion and analyzes the header portion for a specific modulation, for instance modulation and coding schemes (MCS), bandwidth and/or the number of spatial streams (NSS), preferably a combination thereof. If the header portion of a transmission frame comprises such a combination, the processing unit 13 further processes the frame completely including the analysis of the data or payload portion. However, if the header portion of a transmission frame does not comprise the target combination, for instance a higher MCS, bandwidth and/or NSS, the processing unit 13 enables the communication unit 11 to immediately cancel the reception of the said frame further and will not continue to process the data portion of the frame.

The device 10 further comprises a trigger unit 15 connected to the processing unit 13. In this context, the trigger unit can be an external module, connected to the processing unit 13 via RF cables and may comprise user interface in order to receive user specific trigger conditions. Alternatively, the trigger unit 15 can be an integral module of the processing unit 13. The trigger unit 15 preferably triggers configurable pulses for a specific modulation, for instance for one MCS out of the several MCS, thereby training the processing unit 13 resp. the device 10 for a specific test combination. As a result, the trigger pulses configure the processing unit 13 to process frames only for a selective combination of MCS, bandwidth and NSS and to cancel the reception and further processing of frames for other combinations. Consequently, the device under test 1 will select a transmission parameter, for instance a target MCS to be measured due to the cancellation of the reception of frames with higher MCS. Usually, MCS is high at the beginning of the test and will then be reduced during the test.

The device 10 may optionally comprise a memory unit 17, connected to the processing unit 13 and further to the trigger unit 15. The memory unit 17 can thereby store the processed and target rate information. In addition, the memory unit 17 may store programs required for processing and controlling of the processing unit 13. The memory unit 17 may be implemented into a flash-type storage, a hard disc-type storage, a random access memory, a read-only memory and the like.

The device 10 along with the device under test 1 form an embodiment of the system 20 according to the third aspect of the invention. The system 20 hereby operates as a part of a basic service set (BSS) in a wireless local area network (WLAN) according to the IEEE 802.11 standards. In this context, the device 10 may operate as a WLAN master or an access point (AP) and the device under test 1 may operate as a WLAN slave or a station (STA). Additionally or alternatively, the device 10 may act as a WLAN slave and the device under test 1 may act as a WLAN master.

In FIG. 3, a table for specific combinations of MCS, bandwidth and NSS is illustrated by way of an example. In this context, the "x" mark indicates an allowed combination of MCS, bandwidth and NSS for a given test condition. Additionally, the unmarked fields indicate the combinations which are not allowed for a given test condition. These combinations are obtained from the header portion, preferably as a part of the signalization portion of the header of a transmitting frame. The illustrated table may act as a reference for a user in order to train the device for a selective combination, for instance by means of the trigger pulses.

Figure 4:
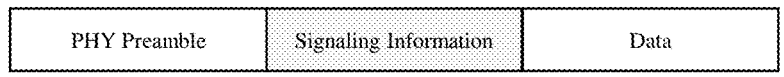
FIG. 4 shows reference PPDU transmission frames by way of example only.
Figure 4:
Figure 4:
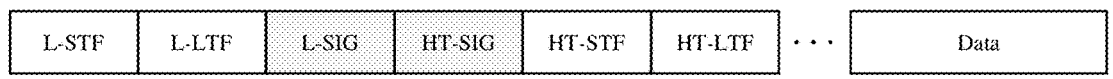
Figure 4:
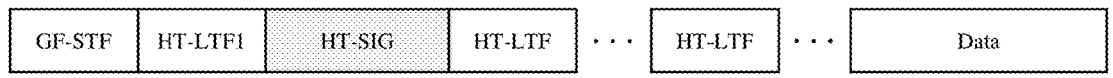
Figure 4:
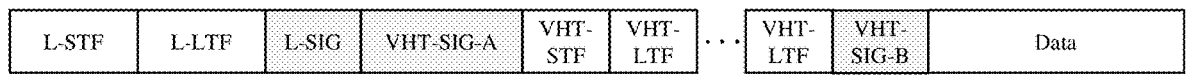

In FIG. 4, reference physical protocol data unit (PPDU) transmission frames are illustrated by way of example only. In this context, transmission frames according to non-high throughput format (NON_HT), high throughput mixed format (HT_MF), high throughput greenfield format (HT_GT) and very high throughput format (VHT) are illustrated followed by a generic burst transmission frame format.

Generally, each PPDU transmission frame, for instance a burst transmission frame, comprises a legacy preamble or header fields including a physical layer specific preamble (PHY-preamble) along with signaling information and a data or payload portion. The PHY-preamble contains information needed by the physical layer transmitters and receivers in order to synchronize with each individual incoming frames. The signalization portion of the header contains legacy signal (L-SIG) contains the modulation rate and length of the packet. The data portion is generally used to transmit media access control (MAC) frames. Advantageously, the PPDU frame formats share the same preambles and legacy signal fields so that legacy stations can also decode the signal field for backward compatibility.

For instance, the PHY-preamble for NON_HT, HT_MF and VHT utilizes legacy short training and long training fields (L-STF, L-LTF) along with the legacy signal in order to provide backward compatibility. Therefore, it is possible to identify the transmission rate indices of a received burst frame by analyzing only or up to the header portion of the frame.

It is important to note that the method according to the first aspect corresponds to the device according to the second aspect and the system according to the third aspect. Therefore, the disclosure with regard to any of the aspects is also relevant with regard to the other aspects of the invention.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A method for testing a device under test at a specific channel condition comprising the steps of:
    initiating a communication with the device under test,
    receiving a transmission frame from the device under test with a header portion comprising a specific transmission rate information,
    analyzing the header portion of the transmission frame in order to determine whether the device under test is transmitting with the specific transmission rate information; and
    cancelling the reception of the transmission frame if the device under test is not transmitting with the specific transmission rate information.

2. The method according to claim 1,
    wherein the method further comprises the step of processing the transmission frame if the header portion comprises the specific transmission rate information.

3. The method according to claim 1,
    wherein the method further comprises the step of withholding the processing of the transmission frame if the header portion does not comprise the specific transmission rate information.

4. The method according to claim 1,
    wherein the specific transmission rate information comprises information regarding a selective modulation or coding scheme or bandwidth or the number of spatial streams or a combination thereof.

5. The method according to claim 1,
    wherein the method further comprises the step of receiving the transmission rate information from the device under test during and/or after initiating the communication.

6. The method according to claim 1,
    wherein the method further comprises the step of receiving the transmission frame with a predefined length, preferably a predefined minimum and/or maximum length.

7. The method according to claim 1,
    wherein the method further comprises the step of triggering an external pulse with respect to a modulation or coding scheme or bandwidth or the number of spatial streams or a combination thereof in order to define the transmission rate information.

8. The method according to claim 7,
    wherein the external pulse is configurable and wherein the external pulse is triggered dynamically.

9. A device for testing a device under test at a specific channel condition comprising:
    a communication unit adapted to initiate a communication with the device under test and further adapted to receive a transmission frame from the device under test with a header portion comprising a specific transmission rate information, and
    a processing unit adapted to analyze the header portion of the transmission frame in order to determine whether the device under test is transmitting with the specific transmission rate information,
    wherein the communication unit is further adapted to cancel the reception of the transmission frame if the device under test is not transmitting with the specific transmission rate information.

10. The device according to claim 9,
    wherein the processing unit is further adapted to process the transmission frame if the header portion comprises the specific transmission rate information.

11. The device according to claim 9,
    wherein the processing unit is further adapted to withhold the processing of the transmission frame if the header portion does not comprise the specific transmission rate information.

12. The device according to claim 9,
    wherein the specific transmission rate information comprises information regarding a selective modulation or coding scheme or bandwidth or the number of spatial streams or a combination thereof.

13. The device according to claim 9,
    wherein the communication unit is further adapted to receive the transmission rate information from the device under test during and/or after initiating the communication.

14. The device according to claim 9,
    wherein the communication unit is further adapted to receive the transmission frame with a predefined length, preferably a predefined minimum and/or maximum length.

15. The device according to claim 9,
    wherein the device further comprises a trigger unit adapted to trigger an external pulse with respect to a modulation and coding scheme or bandwidth or the number of spatial streams in order to define the transmission rate information or a combination thereof.

16. The device according to claim 15,
wherein the external pulse is configurable and wherein the trigger module is further adapted to trigger the external pulse dynamically.

17. A system comprising a device of claim 9 and a device under test for testing the device under test at a specific channel condition.

18. The system according to claim 17,
wherein the system operates as a part of a Basic Service Set in a wireless local area network.

\* \* \* \* \*